US012652813B2

(12) United States Patent
Ishikawa et al.

(10) Patent No.: US 12,652,813 B2
(45) Date of Patent: Jun. 9, 2026

(54) SEMICONDUCTOR DEVICE

(71) Applicant: FUJI ELECTRIC CO., LTD.,
Kanagawa (JP)

(72) Inventors: Takamasa Ishikawa, Matsumoto (JP);
Noriaki Yao, Matsumoto (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 700 days.

(21) Appl. No.: 17/844,763

(22) Filed: Jun. 21, 2022

(65) Prior Publication Data

US 2022/0320324 A1      Oct. 6, 2022

Related U.S. Application Data

(63) Continuation of application No.
PCT/JP2021/026376, filed on Jul. 13, 2021.

(30) Foreign Application Priority Data

Jul. 14, 2020      (JP) ................................. 2020-120909

(51) Int. Cl.
*H10D 12/00*          (2025.01)
*H10D 8/00*           (2025.01)
(Continued)

(52) U.S. Cl.
CPC ........... *H10D 12/481* (2025.01); *H10D 8/422*
(2025.01); *H10D 62/53* (2025.01); *H10D
62/60* (2025.01)

(58) Field of Classification Search
CPC ...... H10D 12/481; H10D 8/422; H10D 62/60;
H10D 62/53
See application file for complete search history.

(56) References Cited

U.S. PATENT DOCUMENTS

2013/0249058 A1      9/2013   Neidhart
2014/0299915 A1      10/2014  Kouno
(Continued)

FOREIGN PATENT DOCUMENTS

CN          109417093 A       3/2019
JP          2007266233 A      10/2007
(Continued)

OTHER PUBLICATIONS (ISA/237) Written Opinion of the International Search Authority for
International Patent Application No. PCT/JP2021/026376, issued/
mailed by the Japan Patent Office on Sep. 14, 2021.
(Continued)

*Primary Examiner* — Christine A Enad

(57)          ABSTRACT

Provided is a semiconductor device, wherein the buffer
region of the semiconductor substrate has a plurality of
hydrogen chemical concentration peaks arranged in different
positions in the depth direction of the semiconductor sub-
strate, a plurality of doping concentration peaks; and a high
concentration region provided between the deepest hydro-
gen chemical concentration peak and the drift region,
wherein the doping concentration distribution of the depth
direction of the high concentration region has a slope where
the doping concentration gradually decreases toward the
drift region, wherein the slope includes a convex portion on
top, wherein in an approximate concentration line that
approximates a gradient of the slope with a straight line,
when the concentration in a depth position of the shallowest
doping concentration peak is referred to as the shallowest
reference concentration, the doping concentration of the
shallowest doping concentration peak is from 5% to 50% of
the shallowest reference concentration.

23 Claims, 11 Drawing Sheets

DEPTH POSITION FROM LOWER SURFACE (μm)

(51) Int. Cl.
    *H10D 62/53*         (2025.01)
    *H10D 62/60*         (2025.01)

(56)          References Cited

U.S. PATENT DOCUMENTS

| | | |
|---|---|---|
| 2015/0179441 A1 | 6/2015 | Onozawa |
| 2015/0357229 A1 | 12/2015 | Schulze |
| 2016/0141399 A1 | 5/2016 | Jelinek |
| 2016/0211336 A1 | 7/2016 | Laven |
| 2016/0329401 A1 | 11/2016 | Laven |
| 2017/0062568 A1 | 3/2017 | Caspary |
| 2017/0278929 A1 | 9/2017 | Tetsutaro |
| 2017/0352730 A1 | 12/2017 | Nakamura |
| 2018/0012762 A1 | 1/2018 | Mukai |
| 2018/0019131 A1 | 1/2018 | Suzuki |
| 2018/0122895 A1 | 5/2018 | Jelinek |
| 2018/0130875 A1 | 5/2018 | Suzuki |
| 2018/0182844 A1 | 6/2018 | Nakamura |
| 2019/0027561 A1* | 1/2019 | Ohi ..................... H01L 29/1095 |
| 2019/0148500 A1 | 5/2019 | Agata |
| 2020/0058506 A1 | 2/2020 | Nakamura |
| 2020/0194562 A1 | 6/2020 | Yoshimura |
| 2021/0043739 A1* | 2/2021 | Kato .................. H10D 30/0512 |
| 2021/0273053 A1 | 9/2021 | Suzuki |
| 2022/0059681 A1 | 2/2022 | Suzuki |
| 2022/0115522 A1 | 4/2022 | Otsuka |
| 2022/0208962 A1 | 6/2022 | Tanaka |
| 2023/0126799 A1 | 4/2023 | Sakaguchi |
| 2023/0387218 A1 | 11/2023 | Hoshi |
| 2023/0420524 A1 | 12/2023 | Suzuki |
| 2024/0072124 A1 | 2/2024 | Miyata |
| 2024/0339500 A1 | 10/2024 | Nakamura |
| 2025/0248082 A1 | 7/2025 | Nakamura |

FOREIGN PATENT DOCUMENTS

| | | | |
|---|---|---|---|
| JP | 2013138172 A | 7/2013 | |
| JP | 2018078216 A | 5/2018 | |
| JP | 2018107303 A | 7/2018 | |
| JP | 2020027921 A | 2/2020 | |
| JP | 2020107917 A | 7/2020 | |
| JP | 2020182009 A | 11/2020 | |
| JP | 2021141094 A | 9/2021 | |
| JP | 2022035046 A | 3/2022 | |
| JP | 2022062443 A | 4/2022 | |
| JP | 2022103589 A | 7/2022 | |
| JP | 2023062606 A | 5/2023 | |
| JP | 2023172669 A | 12/2023 | |
| JP | 2024003330 A | 1/2024 | |
| JP | 2024029821 A | 3/2024 | |
| JP | 2024149006 A | 10/2024 | |
| JP | 2025115000 A | 8/2025 | |
| WO | 2014065080 A1 | 5/2014 | |
| WO | 2016120999 A1 | 8/2016 | |
| WO | 2016147264 A1 | 9/2016 | |
| WO | 2016204126 A1 | 12/2016 | |
| WO | 2017047285 A1 | 3/2017 | |
| WO | 2018074434 A1 | 4/2018 | |
| WO | 2020100995 A1 | 5/2020 | |

OTHER PUBLICATIONS

Office Action issued for counterpart Chinese Application 202180007451.
6, issued by The State Intellectual Property Office of People's
Republic of China on Sep. 13, 2025.

\* cited by examiner

<u>100</u>

SEMICONDUCTOR DEVICE

The contents of the following Japanese patent applications are incorporated herein by reference:

NO. 2020-120909 filed in JP on Jul. 14, 2020, and
PCT/JP2021/026376 filed in WO on Jul. 13, 2021.

BACKGROUND

1. Technical Field

The present invention relates to a semiconductor device.

2. Related Art

Conventionally, in a semiconductor device such as an IGBT (insulated gate bipolar transistor), a structure is known which is provided with a buffer region with a higher doping concentration than a drift region (for example, refer to Patent Document 1).

Patent Document 1: WO2018-074434

DESCRIPTION OF EXEMPLARY EMBODIMENTS

Figure 1:
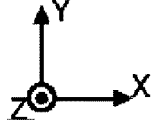
FIG. 1 illustrates a top view showing one example of a semiconductor device 100 according to one embodiment of the present invention.

Hereinafter, (some) embodiment(s) of the present invention will be described. The embodiment(s) do(es) not limit the invention according to the claims. And all the combinations of the features described in the embodiment(s) are not necessarily essential to means provided by aspects of the invention.

In the present specification, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicating the height direction with respect to the ground. It is noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing a donor or an acceptor into a semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration as the concentration of positive ions to the acceptor concentration as the concentration of negative ions, including the polarities of charges. As an example, when the donor concentration is $N_D$ and the acceptor concentration is $N_A$, the net doping concentration at any position is given as $N_D$-$N_A$.

The donor has the function of supplying electrons to a semiconductor. The acceptor has the function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

The term P+ type or N+ type described in the present specification means that the doping concentration is higher than that of the P type or N type, and the term P− type or N− type described in the present specification means that the doping concentration is lower than that of the P type or N type. Further, in the present specification, a description of a P++ type or an N++ type means a higher doping concentration than the P+ type or the N+ type.

A chemical concentration in the present specification refers to an atomic density of an impurity measured regardless of an electrical activation state. The chemical concentration can be measured by, for example, the Secondary Ion Mass Spectrometry (SIMS) method. The net doping concentration described above can be measured by voltage-capacitance profiling (CV method). Further, a carrier concentration measured by spreading resistance profiling (SRP method) may be set as the net doping concentration. The carrier concentration measured by the CV method or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration.

In addition, in a case where the concentration distribution of a donor, an acceptor, or net doping has a peak, the peak value may be used as the concentration of the donor, the acceptor, or the net doping in the region. In a case where the concentration of a donor, an acceptor, or net doping is substantially uniform or the like, the average value of the concentration of the donor, the acceptor, or the net doping in the region may be used as the concentration of the donor, the acceptor, or the net doping.

The carrier concentration measured by the SRP method may be lower than the concentration of the donor or the acceptor. In a range where current flows when a spreading resistance is measured, the carrier mobility of the semiconductor substrate may be lower than a value of a crystal state. The reduction in carrier mobility occurs when carriers are scattered due to disorder (disorder) of a crystal structure due to a lattice defect or the like.

The concentration of the donor or the acceptor calculated from the carrier concentration measured by the CV method or the SRP method may be lower than a chemical concentration of an element indicating the donor or the acceptor. By way of example, the donor concentration of phosphorus or arsenic as a donor, or the acceptor concentration of boron (boron) as an acceptor in a silicon semiconductor is approximately 99% of chemical concentrations of these. On the other hand, the donor concentration of hydrogen as a donor in the silicon semiconductor is approximately 0.1% to 10% of the chemical concentration of hydrogen.

Unless otherwise stated, SI unit system is used as unit system herein. Although the unit of length is indicated by cm or the like, various calculations may be performed to convert cm into meter (m).

FIG. 1 illustrates a top view showing an example of a semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 has an end side 202 in a top view. When the top view is simply mentioned in the present specification, it means that the semiconductor substrate 10 is viewed from an upper surface side. The semiconductor substrate 10 of this example has two sets of end sides 202 opposite to each other in the top view. In FIG. 1, the X axis and the Y axis are parallel to any of the end sides 202. In addition, the Z axis is perpendicular to the upper surface of the semiconductor substrate 10.

The semiconductor substrate 10 is provided with an active portion 160. The active portion 160 is a region in which main current flows in the depth direction between the upper surface and the lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor element such as an IGBT, or a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. In another example, the active portion 160 may be provided with only one of the transistor portion 70 and the diode portion 80.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, the region where the cathode region is provided is referred to as the diode portion 80. In other words, the diode portion 80 is a region overlapping with the cathode region in a top view. On the lower surface of the semiconductor substrate 10, a collector region of P+ type may be provided in a region other than the cathode region. In the present specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. In addition, in the transistor portion 70, there is periodically arranged a gate structure, which includes an N type emitter region, a P type base region, a gate conductive portion, and a gate dielectric film, on the upper surface side on the semiconductor substrate 10.

The semiconductor device 100 may have one or more pads above the semiconductor substrate 10. The semiconductor device 100 of this example has a gate pad 112. The semiconductor device 100 may have a pad such as an anode pad, a cathode pad, and a current detection pad. Each pad is arranged in the vicinity of the end side 202. The region close to the end side 202 refers to a region between the end side 202 and the emitter electrode in the top view. When the semiconductor device 100 is mounted, each pad may be connected to an external circuit via wiring such as a wire.

A gate potential is applied to the gate pad 112. The gate pad 112 is electrically connected to a conductive portion of a gate trench portion of the active portion 160. The semiconductor device 100 includes a gate runner connecting the gate pad 112 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 202 of the semiconductor substrate 10 in the top view. The outer circumferential gate runner 130 of this example encloses the active portion 160 in the top view. A region enclosed by the outer circumferential gate runner 130 in the top view may be the active portion 160. In addition, the outer circumferential gate runner 130 is connected to the gate pad 112. The outer circumferential gate runner 130 is arranged above the semiconductor substrate 10. The outer circumferential gate runner 130 may be a metal wiring containing aluminum or the like.

The active-side gate runner 131 is provided in the active portion 160. Providing the active-side gate runner 131 in the active portion 160 allows the variation in the wiring length from the gate pad 112 to be reduced for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. In a case where the active portion 160 is divided by the active-side gate runner 131, the transistor portion 70 and the diode portion 80 may be alternately arranged in the X axis direction in each divided region.

Further, the semiconductor device 100 may include a temperature sensing portion (not illustrated) that is a PN junction diode formed of polysilicon or the like, and a current detection portion (not illustrated) that simulates an operation of the transistor portion provided in the active portion 160.

The semiconductor device 100 of this example includes an edge termination structure portion 90 between the active portion 160 and the end side 202. The edge termination structure portion 90 of this example is arranged between the outer circumferential gate runner 130 and the end side 202. The edge termination structure portion 90 reduces an electric field strength on the upper surface side of the semiconductor substrate 10. The edge termination structure portion 90 includes a plurality of guard rings 92. The guard ring 92 is a P type region in contact with the upper surface of the semiconductor substrate 10. The active portion 160 may be enclosed by the guard ring 92 in a top view. Between the outer circumferential gate runner 130 and the end side 202, the plurality of guard rings 92 are arranged at predetermined intervals. A guard ring 92 arranged on an outer side may enclose a guard ring 92 arranged further inward. The outer side refers to a side close to the end side 202, and the inner side refers to a side close to the outer circumferential gate runner 130. Providing the plurality of guard rings 92 allows the depletion layer on the upper surface side of the active portion 160 to be extended outward and can improve the breakdown voltage of the semiconductor device 100. The edge termination structure portion 90 may further include at least one of a field plate or a RESURF annularly provided to enclose the active portion 160.

Figure 2:
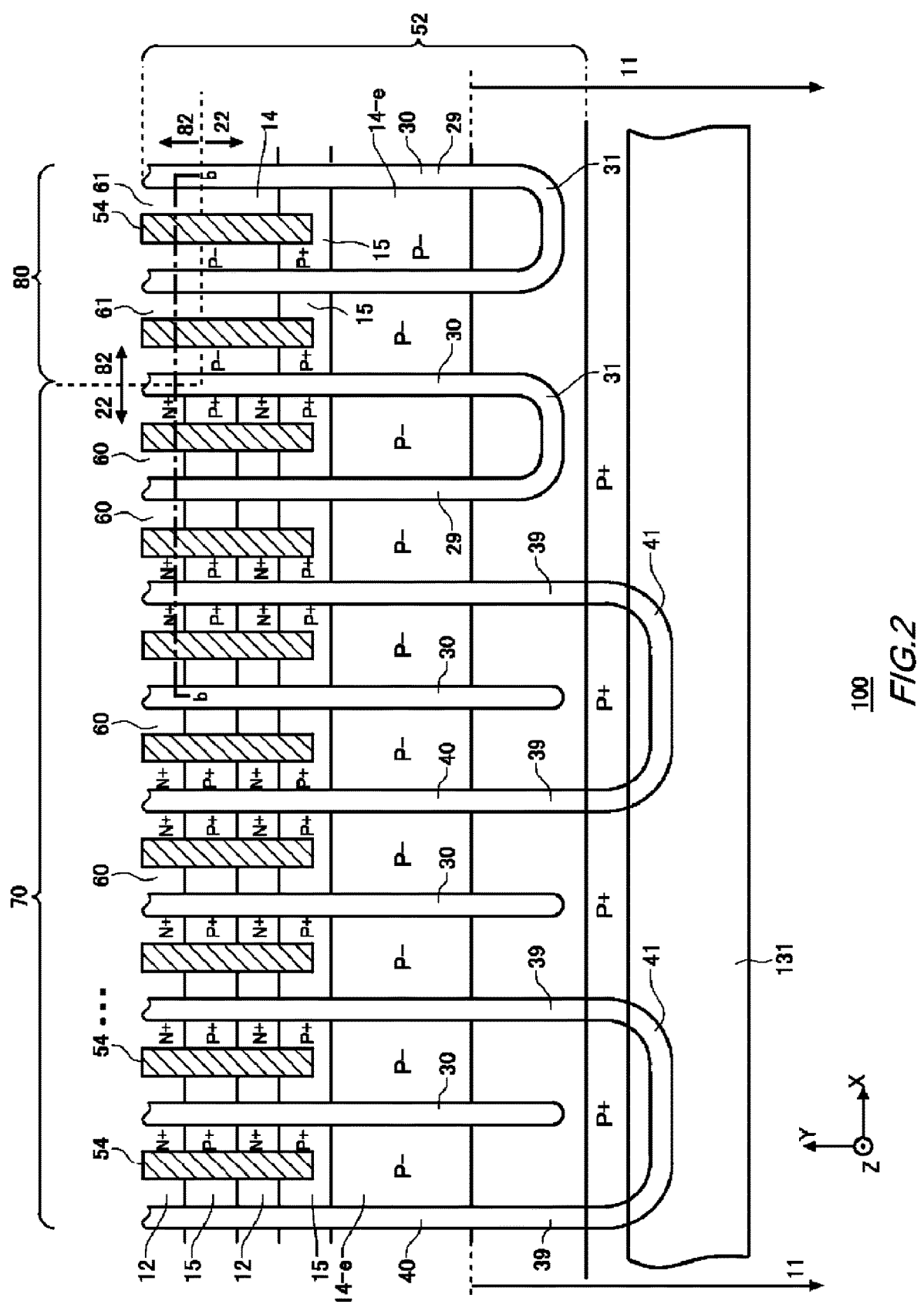
FIG. 2 illustrates an enlarged drawing of a region A in FIG. 1.

FIG. 2 illustrates an enlarged drawing of a region A in FIG. 1. The region A is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15, which are provided inside on the upper surface side of the semiconductor substrate 10. The gate trench portion 40 and the dummy trench portion 30 each are an example of the trench portion. In addition, the semiconductor device 100 of this example includes an emitter electrode 52 and the active-side gate runner 131 which are provided above the upper surface of the semiconductor substrate 10. The emitter electrode 52 and the active-side gate runner 131 are provided to be separated from each other.

An interlayer dielectric film is provided between the emitter electrode 52 and the active-side gate runner 131, and the upper surface of the semiconductor substrate 10, but the interlayer dielectric film is omitted in FIG. 1. In the interlayer dielectric film of this example, a contact hole 54 is provided to pass through the interlayer dielectric film. In FIG. 2, each contact hole 54 is hatched with diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 2 shows a range in which an emitter electrode 52 is provided. For example, at least a part of a region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in a layer below a region formed of aluminum or the like. Further, a plug, which is formed by embedding tungsten or the like so as to be in contact with the barrier metal and aluminum or the like, may be included in the contact hole.

The well region 11 is provided to be overlapped with the active-side gate runner 131. The well region 11 is provided to extend with a predetermined width even in a range where the active-side gate runner 131 is not overlapped. The well region 11 of this example is provided to be separated from the end of the contact hole 54 in the Y axis direction toward the active-side gate runner 131 side. The well region 11 is a second conductivity type region in which its doping concentration is higher than that of the base region 14. The base region 14 in this example is a P– type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 (trench portions that are linear along the extending direction) extending along the extending direction perpendicular to the array direction, and the edge portion 41 for connecting the two linear portions 39. The extending direction in FIG. 2 is the Y axis direction.

At least a part of the edge portion 41 is preferably provided in a curved shape in a top view. The end portions of two linear portions 39 in the Y axis direction are connected by the edge portion 41, so that the electric field strength in the end portion of the linear portion 39 can be reduced.

In the transistor portion 70, the dummy trench portion 30 is provided between the respective linear portions 39 of the gate trench portion 40. Between the respective linear portions 39, one dummy trench portion 30 may be provided, or a plurality of dummy trench portions 30 may be provided. The dummy trench portion 30 may be in a linear shape extending in the extending direction, or may include a linear portion 29 and an edge portion 31 similarly to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depths of the gate trench portion 40 and the dummy trench portion 30. The end portions in the Y axis direction of the gate trench portion 40 and the dummy trench portion 30 are provided in the well region 11 in a top view. In other words, the bottom portion in the depth direction of each trench portion is covered with the well region 11 at the end portion in the Y axis direction of each trench portion. With this configuration, the electric field strength in the bottom portion of each trench portion can be reduced.

A mesa portion is provided between respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench portion, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-*e*. While FIG. 2 shows the base region 14-*e* arranged at one end portion of each mesa portion in the extending direction, the base region 14-*e* is also arranged at the other end portion of each mesa portion. In each mesa portion, at least one of the first conductivity type emitter region 12 or the second conductivity type contact region 15 may be provided in the region sandwiched between the base regions 14-*e* in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided on the upper surface of the mesa portion 61. In the region sandwiched between the base regions 14-*e* on the upper surface of the mesa portion 61, the contact region 15 may be provided in contact with each base region 14-*e*. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in a region sandwiched between the base regions 14-*e*. The contact hole 54 of this example is provided above respective regions of the contact region 15, the base region 14, and the emitter region 12. The contact hole 54 is not provided in a region corresponding to the base region 14-*e* and the well region 11. The contact hole 54 may be arranged at the center in the array direction (X axis direction) of the mesa portion 60.

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. In FIG. 2, a boundary between the cathode region 82 and the collector region 22 is indicated by a dotted line.

The cathode region 82 is arranged away from the well region 11 in the Y axis direction. As a result, a distance between the P type region (well region 11) having a relatively high doping concentration and formed up to a deep position and the cathode region 82 is secured, and the breakdown voltage can be improved. The end portion of the cathode region 82 of this example in the Y axis direction is arranged apart from the well region 11 than the end portion of the contact hole 54 in the Y axis direction. In another example, the end portion in the Y axis direction of the cathode region 82 may be arranged between the well region 11 and the contact hole 54.

Figure 3:
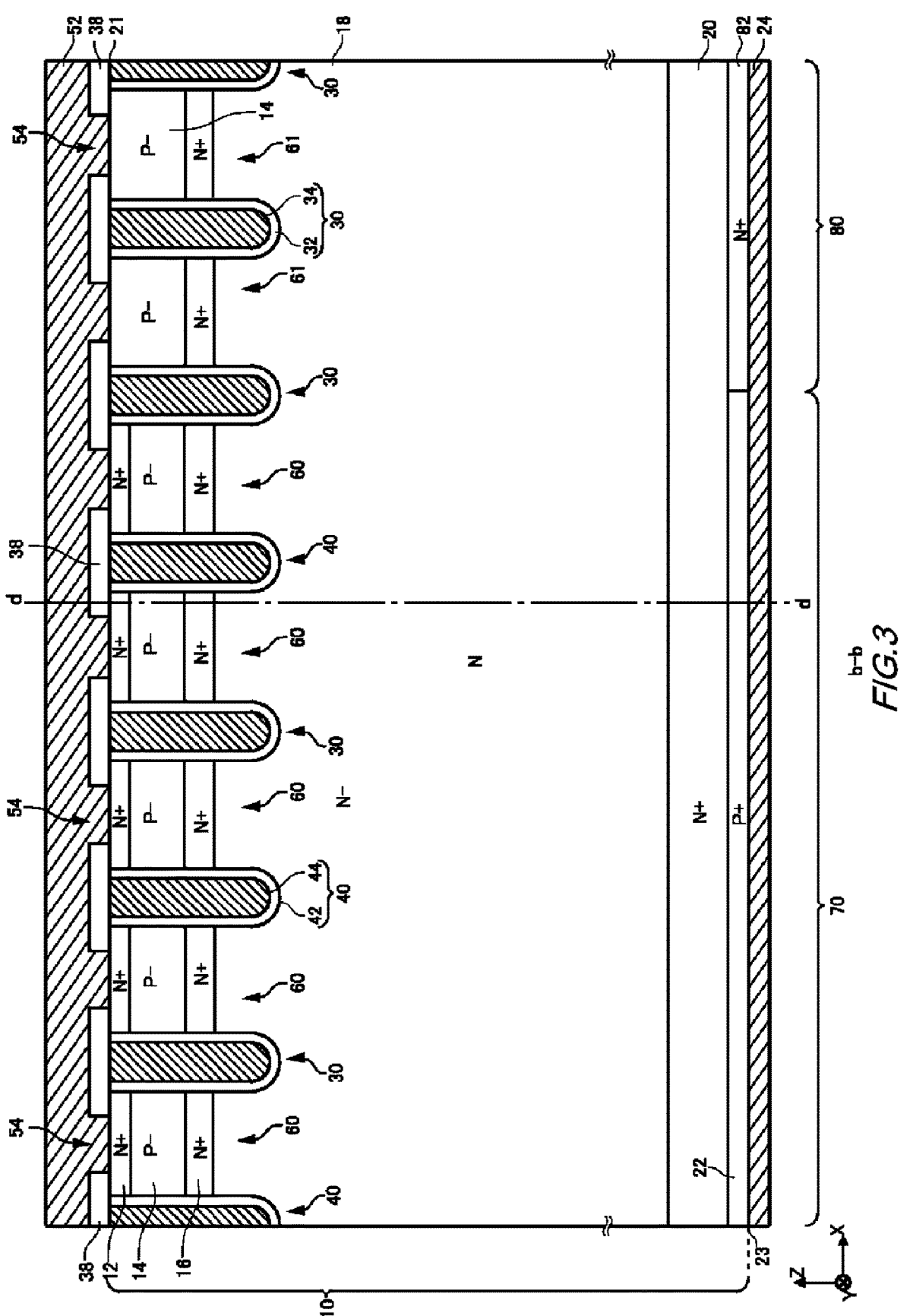
FIG. 3 illustrates one example of cross section b-b in FIG. 2.

FIG. 3 illustrates an example of a cross section b-b in FIG. 2. The cross section b-b is an XZ plane passing through the emitter region 12 and the cathode region 82. The semiconductor device 100 of this example includes the semiconductor substrate 10, an interlayer dielectric film 38, the emitter electrode 52, and a collector electrode 24 in the cross section. The interlayer dielectric film 38 is provided on the upper surface of the semiconductor substrate 10. The interlayer dielectric film 38 is a film including at least one of a dielectric film such as silicate glass to which an impurity such as boron or phosphorus is added, a thermal oxide film, or other dielectric films. The interlayer dielectric film 38 is provided with the contact hole 54 described in FIG. 2.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, the direction (Z axis direction) connecting the emitter electrode 52 and the collector electrode 24 is referred to as a depth direction.

The semiconductor substrate 10 has an N– type drift region 18. The drift region 18 is a region with a doping concentration matching the donor concentration of the bulk donor. Details about the bulk donor are described below. The drift region 18 is provided in each of the transistor portion 70 and the diode portion 80.

In the mesa portion 60 of the transistor portion 70, an N+ type emitter region 12 and a P– type base region 14 are provided in order from the upper surface 21 side of the semiconductor substrate 10. The drift region 18 is provided below the base region 14. The mesa portion 60 may be provided with an N+ type accumulation region 16. The accumulation region 16 is arranged between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. By providing the high-concentration accumulation region 16 between the drift region 18 and the base region 14, the carrier injection-enhancement effect (IE effect) can be increased, and the ON voltage can be reduced. The accumulation region 16 may be provided to cover a whole lower surface of the base region 14 in each mesa portion 60.

The mesa portion 61 of the diode portion 80 is provided with the P– type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 has a plurality of donor concentration peaks with the donor concentration higher than the drift region 18. The plurality of donor concentration peaks are arranged at different positions in the depth direction of the semiconductor substrate 10. At least one of the donor concentration peaks of the buffer region 20 may be a concentration peak of the hydrogen donor. The buffer region 20 may function as a field stopper layer which prevents a depletion layer expanding from the lower end of the base region 14 from reaching the collector region 22 of the P+ type and the cathode region 82 of the N+ type.

In the transistor portion 70, the collector region of the P+ type 22 is provided below the buffer region 20. The acceptor concentration of the collector region 22 is higher than the acceptor concentration of the base region 14. The collector region 22 may include the same acceptor as the base region 14, and may include a different acceptor. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. The donor of the cathode region 82 is, for example, hydrogen or phosphorus. It is noted that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10 to reach the drift region 18. In a region where at least any one of the emitter region 12, the contact region 15, and the accumulation region 16 is provided, each trench portion also passes through the doping regions of these to reach the drift region 18. The trench portion penetrating the doping region is not limited to those manufactured in the order of forming the doping region and then forming the trench portion. A case where a doping region is formed between the trench portions after the trench portion is formed is also included in a case where the trench portion passes through the doping region.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench, a gate dielectric film 42, and a gate conductive portion 44 provided on the upper surface 21 of the semiconductor substrate 10. The gate dielectric film 42 is provided to cover the inner wall of the gate trench. The gate dielectric film 42 may be formed by oxidizing or nitriding the semiconductor in the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portion 30 may have the same structure as the gate trench portion 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad, not depicted, connected to an external circuit different from the gate pad, and may perform different controlling from the gate conductive portion 44. In addition, the dummy conductive portion 34 may be electrically connected to the emitter electrode 52. The dummy dielectric film 32 is provided covering an inner wall of the dummy trench. The dummy conductive portion 34 is provided in the dummy trench, and is provided on the inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottom portions of the dummy trench portion 30 and the gate trench portion 40 may have a surface shape convexly downward (a curved shape in a cross section).

In the semiconductor substrate 10, bulk donors of the first conductivity type (N type) are distributed overall. The bulk donor is a dopant donor substantially uniformly contained in an ingot during the manufacture of the ingot from which the semiconductor substrate 10 is made. The bulk donor of this example is an element other than hydrogen. The dopant of the bulk donor, for example, is phosphorous or antimony, but it is not limited thereto. The bulk donor in this example is phosphorus. The bulk donor is also contained in a P type region. The semiconductor substrate 10 may be a wafer cut out from a semiconductor ingot, or may be a chip obtained by singulating the wafer. The semiconductor ingot may be manufactured by any of a Czochralski method (CZ method), a magnetic-field applied Czochralski method (MCZ method), or a float zone method (FZ method). The ingot of this example is manufactured by the MCZ method. The drift region 18 may be a region with the doping concentration matching the donor concentration of the bulk donor. In another example, the doping concentration of the drift region 18 may be higher than the bulk donor concentration. Also, the bulk donor concentration may be from 90% to 100% of the chemical concentration of the dopant (for example, phosphorous) of the bulk donors distributed uniformly in the semiconductor substrate 10.

Figure 4:
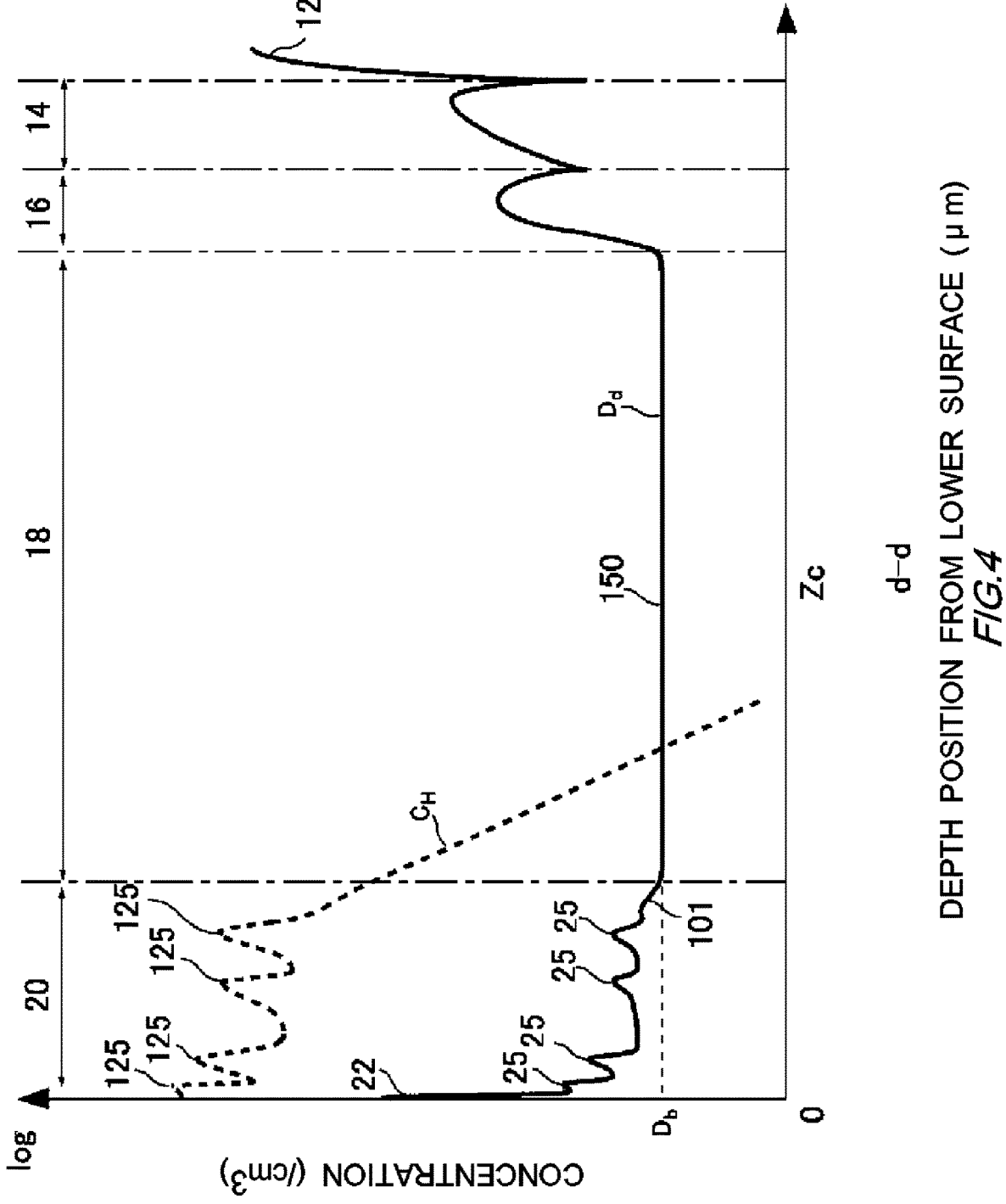
FIG. 4 illustrates an example of a distribution of a doping concentration $D_d$ (/cm$^3$) and a hydrogen chemical concentration $C_H$ (atoms/cm$^3$) along line d-d in FIG. 3.

FIG. 4 illustrates an example of a distribution of the doping concentration $D_d$ (/cm$^3$) and the hydrogen chemical concentration $C_H$ (atoms/cm$^3$) along the line d-d in FIG. 3.

The line d-d in the present example passes through the emitter region 12, the base region 14, the accumulation region 16, the buffer region 20 and the collector region 22 in the transistor portion 70. The doping concentration $D_d$ may be a carrier concentration measured by the SRP method. The hydrogen chemical concentration $C_H$ may be an atomic density of the hydrogen atoms measured by a SIMS method. In FIG. 4, the vertical axis is a logarithmic axis indicating each concentration. The horizontal axis indicates the depth position with reference to the lower surface 23 of the semiconductor substrate 10. That is, the horizontal axis regards the position of the lower surface 23 as 0, and indicates the distance (μm) from each position to the lower surface 23. In FIG. 4, the center position in the depth direction of the semiconductor substrate 10 is referred to as Zc.

Dopants of the N type, such as phosphorous or the like, are ion-implanted to the emitter region 12 in the present example. Dopants of the P type, such as boron, are ion-implanted to the base region 14 in the present example. Dopants of the N type, such as phosphorous or the like, are ion-implanted to the accumulation region 16. Dopants of the P type, such as boron, are ion-implanted to the collector region 22. Each of the emitter region 12, the base region 14, the accumulation region 16 and the collector region 22 in the present example has a peak of the doping concentration. In another example, at least one of the emitter region 12, the base region 14, the accumulation region 16 or the collector region 22 may have an approximately flat doping concentration distribution, without a peak of the doping concentration. For example, by the ion implantation to a plurality of depth positions and heat treatment, an approximately flat doping concentration distribution can be formed. Also, by the method such as epitaxial growth, the approximately flat doping concentration distribution can be formed.

The drift region 18 is a region with a lower doping concentration than the emitter region 12. The drift region 18 may have a flat portion 150 with an approximately flat doping concentration distribution. The doping concentration of the drift region 18 may be the same as the concentration $D_b$ of the bulk donor included uniformly across the entire of the semiconductor substrate 10. That is, the drift region 18 may be a region with the bulk donor concentration $D_b$ remained as it is without implanting the dopant locally. In another example, the doping concentration of the drift region 18 may be higher than the bulk donor concentration $D_b$.

For example, in the drift region 18, VOH defects (also referred to as hydrogen donors) that combine lattice defects such as a vacancies (V), oxygen (O), hydrogen (H) in the semiconductor substrate 10 may also be distributed. The oxygen added intentionally at the time of manufacturing the ingot or not intentionally may be distributed across the entire of the semiconductor substrate 10. Also, the lattice defects formed intentionally or not intentionally are distributed in at least a partial region of the semiconductor substrate 10. By implanting hydrogen to the semiconductor substrate 10 and heat treatment, the hydrogen donors may be formed in the region where the hydrogen diffuses.

In particular, by irradiating the semiconductor substrate 10 with charged particle beams such as electron beams, helium ions, hydrogen ions and so on, vacancy-based lattice defects, such as monoatomic vacancies (V) and deviancies (VV), are formed in the passed-through region through which the charged particle beams pass. Atoms adjacent to the vacancies have dangling bonds. Although lattice defects may include interstitial atoms, dislocations or the like, and in a broad sense, may include donors and acceptors, in the present specification, vacancy-based lattice defects may be referred to as vacancy-type lattice defects, vacancy-type defects, or merely lattice defects. Also, by forming a lot of lattice defects, the crystallinity of the semiconductor substrate 10 may be strongly disordered. In the present specification, this disorder of crystallinity may be referred to as a disorder.

By forming the passed-through region and perform the heat treatment on the semiconductor substrate 10 to which hydrogen is implanted, hydrogen diffuses in the passed-through region, and hydrogen donors are formed in the passed-through region. Since the oxygen concentration and the defect density in the semiconductor substrate 10 are approximately uniform, the donor concentration of the hydrogen generated in the passed-through region can be approximately uniform. Also, since the length in the depth direction of the passed-through region can be adjusted in the implantation position of the charged particles, the hydrogen donors can be formed in any depth position of the semiconductor substrate 10. Also, the concentration of the hydrogen donor is adjustable by the concentration of the implanted hydrogen, and the density of the lattice defects (that is, the dose amount of the charged particles) formed in the passed-through region. By forming the hydrogen donors or the like, a drift region 18 with a higher doping concentration than the bulk donor concentration and provided across the long region in the depth direction can be formed.

The buffer region 20 has a plurality of hydrogen chemical concentration peaks 125 arranged in different positions in the depth direction of the semiconductor substrate 10. The hydrogen chemical concentration peak 125 is a peak in relation to the hydrogen ion implanted locally to the semiconductor substrate 10. By changing the acceleration energy and implanting the hydrogen ions by a plurality of times to the semiconductor substrate 10, a plurality of hydrogen chemical concentration peaks 125 are formed. The hydrogen ions are implanted from the lower surface 23 of the semiconductor substrate 10, for example. In this case, as shown in FIG. 4, the hydrogen chemical concentration $C_H$ steeply decreases on the upper surface 21 side above the hydrogen chemical concentration peak 125 that is separated furthest from the lower surface 23.

Also, the buffer region 20 has a plurality of doping concentration peaks 25 arranged in different positions in the depth direction of the semiconductor substrate 10. The doping concentration peak 25 may be provided in one-to-one correspondence with hydrogen chemical concentration peak 125. Since a lot of hydrogen donors as described above are formed near the implantation position of hydrogen, a doping concentration peak 25 is formed in the position. In this case, the doping concentration peak 25 is a concentration peak of the hydrogen donor. The doping concentration peak 25 and the hydrogen chemical concentration peak 125 may be provided in the same depth position. Providing the peaks in the same depth position includes the case where the maximum of another peak is included in the full half-width of one peak in addition to the case where the positions of the maximums of the peaks match with each other. The buffer region 20 may have doping concentration peaks 25 in the same number as the hydrogen chemical concentration peaks 125, or may have more doping concentration peaks 25 than the hydrogen chemical concentration peaks 125. For example, by further implanting the N-type dopants different from hydrogen into the buffer region 20, a doping concentration peak 25 of the N-type dopant other than the hydrogen donors can be formed. The doping concentration peak 25 may be arranged between the doping concentration peak 25 in relation to the hydrogen donors and the lower surface 23.

The buffer region 20 has a high concentration region 101 between the deepest hydrogen chemical concentration peak 125 furthest from the lower surface 23 and the drift region 18 among the hydrogen chemical concentration peaks 125. The high concentration region 101 is a region with a slope with a higher doping concentration than the drift region 18 and a doping concentration distribution of the depth direction including a convex portion on top. The slope is in contact with the drift region 18. That is, the slope is a slope that decreases gradually to the doping concentration of the drift region 18 in the direction toward the drift region 18 from the deepest hydrogen chemical concentration peak 125. The convex on top as shown in FIG. 4 refers to the convex on the upper side in the doping concentration distribution with high concentration on the upper side and low concentration at the lower side of the vertical axis.

The high concentration region 101 is a region including the hydrogen donors described above. The high concentration region 101 may be a region formed by diffusing the hydrogen implanted to the depth position Z4. The length in the depth direction of the high concentration region 101 can be controlled by the temperature and time of performing the heat treatment after implanting the hydrogen to the depth position Z4.

Figure 5:
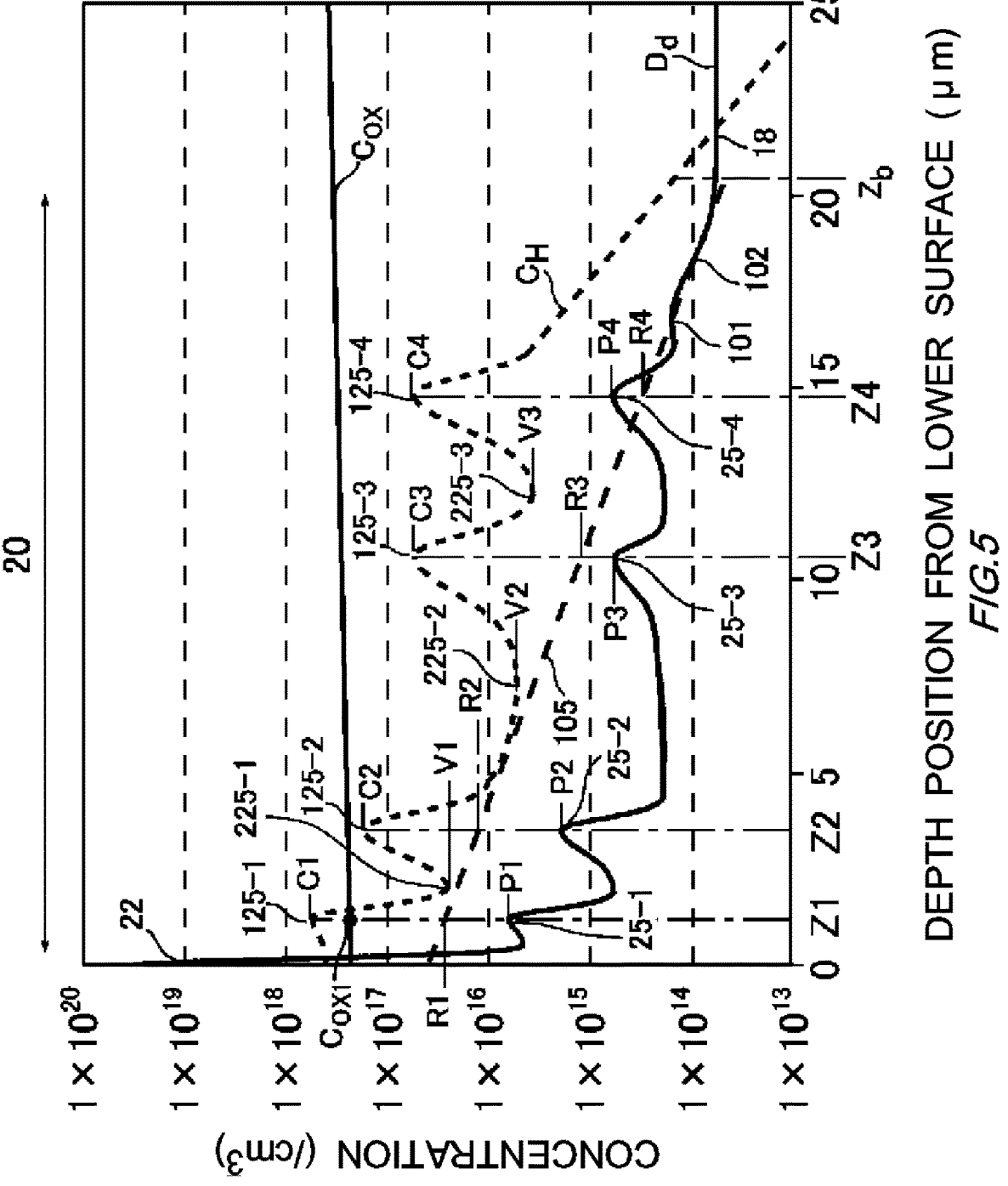
FIG. 5 illustrates an enlarged view near a buffer region 20 in the distribution shown in FIG. 4.

FIG. 5 illustrates an enlarged view near the buffer region 20 in the distribution shown in FIG. 4. Note that in FIG. 5, the distribution of the oxygen chemical concentration $C_{OX}$ is further illustrated. The oxygen chemical concentration $C_{OX}$ may be distributed uniformly in the semiconductor substrate 10. Also, the distribution of the oxygen chemical concentration $C_{OX}$ may have a slight gradient in the depth direction of the semiconductor substrate 10. That is, the oxygen chemical concentration $C_{OX}$ may monotonically increase or decrease along the depth direction of the semiconductor substrate 10. Also the semiconductor substrate 10 may have a region with the oxygen chemical concentration $C_{OX}$ decreased toward the principal surface near at least one principal surface (the lower surface 23 and the upper surface 21) of the semiconductor substrate 10.

In FIG. 5, the plurality of hydrogen chemical concentration peaks 125 is referred to as a first hydrogen chemical concentration peak 125-1, a second hydrogen chemical concentration peak 125-2, a third hydrogen chemical concentration peak 125-3 and a fourth hydrogen chemical concentration peak 125-4 from the lower surface 23 side. The first hydrogen chemical concentration peak 125-1 is a shallowest hydrogen chemical concentration peak closest to the lower surface 23. Also, the fourth hydrogen chemical concentration peak 125-4 is a deepest hydrogen chemical concentration peak furthest from the lower surface 23. Note that the number of the hydrogen chemical concentration peaks 125 is not limited to four. Among the plurality of hydrogen chemical concentration peaks 125 arranged between the drift region 18 and the lower surface 23, the hydrogen chemical concentration peak 125 closest to the drift region 18 is the deepest hydrogen chemical concentration peak. The hydrogen chemical concentration of a kth hydrogen chemical concentration peak 125-$k$ is referred to as Ck.

Also, the distribution of the hydrogen chemical concentration $C_H$ has a hydrogen chemical concentration local minimum portion 225 between two hydrogen chemical concentration peaks 125. The hydrogen chemical concentration local minimum portion 225 is a region with the hydrogen chemical concentration $C_H$ being a local minimum value. In FIG. 5, a plurality of hydrogen chemical concentration local minimum portions 225 are referred to as a first hydrogen chemical concentration local minimum portion 225-1, a second hydrogen chemical concentration local minimum portion 225-2 and a third hydrogen chemical concentration local minimum portion 225-3 from the lower surface 23 side. The hydrogen chemical concentration of a kth hydrogen chemical concentration local minimum portion 225-k is referred to as $V_k$.

In FIG. 5, a plurality of doping concentration peaks 25 are referred to as a first doping concentration peak 25-1, a second doping concentration peak 25-2, a third doping concentration peak 25-3 and a fourth doping concentration peak 25-4 from the lower surface 23 side. The first doping concentration peak 25-1 is the shallowest doping concentration peak closest to the lower surface 23. Also, the fourth doping concentration peak 25-4 is the deepest doping concentration peak furthest from the lower surface 23. Note that the number of the doping concentration peak 25 is not limited to four. Among the plurality of doping concentration peaks 25 arranged between the drift region 18 and the collector region 22 (the cathode region 82 in the diode portion 80), the doping concentration peak 25 closest to the drift region 18 is the deepest doping concentration peak.

In the present example, the kth hydrogen chemical concentration peak 125-k and the kth doping concentration peak 25-k are arranged in the depth position Zk. k in the present example refers to an integral from 1 to 4. Also, the doping concentration at the maximum of the kth doping concentration peak 25-k is referred to as $P_k$.

The high concentration region 101 is provided between the fourth hydrogen chemical concentration peak 125-4 and the drift region 18. The distribution of the doping concentration $D_d$ of the high concentration region 101 has a slope 102 in contact with the drift region 18. The slope 102 may decrease in accordance with the decrease of the hydrogen chemical concentration $C_H$ toward the upper surface 21. As described above, the slope 102 is a downward slope with the doping concentration $D_d$ gradually decreased toward the drift region 18 from the fourth hydrogen chemical concentration peak 125-4. The slope 102 includes a convex portion on top. For example the slope 102 may include a convex portion near the region where the doping concentration starts to decrease toward the drift region 18.

The straight line that approximates the gradient of the slope 102 is the approximate concentration line 105. The approximate concentration line 105 may be a straight line that approximates the entire slope 102 with the least squares method. The approximate concentration line 105 is extrapolated to the respective depth positions Z1, Z2, Z3 and Z4. The concentration indicated by the approximate concentration line 105 at the depth positions Z1, Z2, Z3 and Z4 are respectively referred to as the reference concentrations R1, R2, R3 and R4. In the present example, the reference concentration R1 is the shallowest reference concentration, and the reference concentration R4 is the deepest reference concentration.

If the buffer region 20 is formed long in the depth direction, injection of holes into the drift region 18 from the lower surface 23 side is inhibited. When a large current flows as the current between the emitter and collector of the semiconductor device 100, as in the case of a short circuit, if the hole injection from the lower surface 23 side is not sufficient, the electric field is concentrated on the lower surface 23 side and avalanches are likely to occur. Therefore, from the viewpoint of improving short circuit withstand capability, the buffer region 20 is preferably not too long in the depth direction.

Also, if the doping concentration P1 of the first doping concentration peak 25-1 closest to the lower surface 23 is high, the hole injection from the lower surface 23 side is inhibited. Therefore, the doping concentration P1 is preferably not too high. Note that if the doping concentration P1 is too low, the possibility of the depletion layer expanded from the upper surface 21 side reaching the collector region 22 or the like becomes higher. Therefore, the doping concentration P1 is preferably not too low.

Also, when the first doping concentration peak 25-1 is close to the lower surface 23, the scratch generated on the lower surface 23 is easier to reach the first doping concentration peak 25-1. If the scratch reaches the first doping concentration peak 25-1, the breakdown voltage of the semiconductor device 100 decreases. Therefore, the distance between the first doping concentration peak 25-1 and the lower surface 23 is preferably to be secured to some extent.

In the semiconductor device 100 in the present example, the doping concentration P1 of the first doping concentration peak 25-1 is from 5% to 50% of the reference concentration R1. By making the ratio of the doping concentration P1 to the reference concentration R1 to be 5% or more, the buffer region 20 can be suppressed to become longer. In this way, the short circuit withstand capability can be improved. Note that if the buffer region 20 becomes longer, the distance between the slope 102 and the first doping concentration peak 25-1 becomes longer, and the ratio of P1/R1 decreases.

Also, by making P1/R1 to be 5% or more, the first doping concentration peak 25-1 can be suppressed to become close to the lower surface 23. The concentration of the approximate concentration line 105 increases as being closer to the lower surface 23, thus the ratio of P1/R1 decreases. Also, by making P1/R1 to be 50% or less, the first doping concentration peak 25-1 can be suppressed to become a high concentration. In this way, short circuit withstand capability can be improved.

In this way, by making P1/R1 to be from 5% to 50%, the short circuit withstand capability can be improved, also the breakdown voltage can be improved. P1/R1 may be 10% or more, or may be 20% or more. P1/R1 may be 40% or less, or may be 30% or less.

The distance between the first doping concentration peak 25-1 and the lower surface 23 of the semiconductor substrate 10 is preferably 1 μm or more. In this way, the scratch generated on the lower surface 23 can be suppressed to reach the first doping concentration peak 25-1. The distance may be 1.5 μm or more. The distance may be less than 3 μm. In this way, the collector region 22 can be suppressed to be separated too far from the first doping concentration peak 25-1. The distance may be 2.5 μm or less.

The distance between the depth position Z4 of the fourth hydrogen chemical concentration peak 125-4 and the lower surface 23 of the semiconductor substrate 10 may be 20 μm or less. In this way, the decrease in the short circuit withstand capability due to the buffer region 20 being too long is prevented. The distance may be 15 μm or less. Note that the ratio of the distance to the thickness in the depth direction of the semiconductor substrate 10 may be 20% or less, or may be 15% or less.

The distance in the depth direction between the first hydrogen chemical concentration peak 125-1 and the fourth hydrogen chemical concentration peak 125-4 may be 15 μm or less. The distance may be the distance from the depth position Z1 to the depth position Z4. In this way, the decrease in the short circuit withstand capability due to the buffer region 20 being too long is prevented. The distance may be 13 μm or less. Note that the ratio of the distance to the thickness in the depth direction of the semiconductor substrate 10 may be 15% or less, or may be 13% or less.

The distance between the boundary position $Z_b$ of the high concentration region 101 and the drift region 18 and the lower surface 23 of the semiconductor substrate 10 may be 25 μm or less. The boundary position $Z_b$ is the position where the doping concentration $D_d$ firstly matches the doping concentration of the drift region 18 in the direction from the high concentration region 101 toward the drift region 18. In this way, the buffer region 20 is prevented to be too long. The distance may be 20 μm or less. Note that the ratio of the distance to the thickness in the depth direction of the semiconductor substrate 10 may be 25% or less, or may be 20% or less.

The distance between the boundary position $Z_b$ and the position Z4 of the fourth doping concentration peak 25-4 may be 10 μm or less. Even in this case, the buffer region 20 is prevented to be too long. The distance may be 5 μm or less. Note that the ratio of the distance to the thickness in the depth direction of the semiconductor substrate 10 may be 10% or less, or may be 5% or less.

The doping concentration P4 of the fourth doping concentration peak 25-4 may be higher than the reference concentration R4. In this way, the high concentration region 101 is prevented to be too long. If the high concentration region 101 becomes too long, and the distance between the fourth doping concentration peak 25-4 and the boundary position $Z_b$ increases, the reference concentration R4 increases. The doping concentration P4 may be 1.5 times of the reference concentration R4 or more.

The doping concentration P2 of the second doping concentration peak 25-2 may be lower than the reference concentration R2. P2/R2 may be 10% or more, or may be 20% or more. P2/R2 may be 50% or less, or may be 40% or less.

The doping concentration P3 of the third doping concentration peak 25-3 may be lower than the reference concentration R3. P3/R3 may be 10% or more, or may be 20% or more. P3/R3 may be 50% or less, or may be 40% or less. Note that the doping concentration peak between the deepest doping concentration peak 25 and the shallowest doping concentration peak 25 may be lower than any corresponding reference concentration.

The doping concentration P1 of the first doping concentration peak 25-1 may be 10 times of the doping concentration P2 of the second doping concentration peak 25-2 or less. In this way, the doping concentration P1 can be prevented to be too high, and the short circuit withstand capability can be improved. The doping concentration P1 may be 5 times of the doping concentration P2 or less.

The ratio P1/R1 described above may be greater than the ratio P2/R2. In this way, the depth position Z1 can be prevented to be too close to the lower surface 23. The reference concentration R1 becomes higher as the depth position Z1 being closer to the lower surface 23.

The hydrogen chemical concentration C1 of the first hydrogen chemical concentration peak 125-1 may be higher than the reference concentration R1 in the depth position Z1. The hydrogen chemical concentration C1 may be twice or more, or may be 5 times of the reference concentration R1 or more. The hydrogen chemical concentration C1 may be lower than the reference concentration R1.

The hydrogen chemical concentrations C2 to C4 of the second to fourth hydrogen chemical concentration peaks 125-2 to 125-4 may be higher than the reference concentrations R2 to R4 in the depth positions Z2 to Z4, respectively. The hydrogen chemical concentration $C_k$ may be twice or more, or may be 5 times or more of the reference concentration $R_k$. The hydrogen chemical concentration $C_k$ may be lower than the reference concentration $R_k$.

The hydrogen chemical concentration V1 of the first hydrogen chemical concentration local minimum portion 225-1 may be higher or lower than the reference concentration R1 in the depth position Z1. In the present example, the hydrogen chemical concentration V1 may be higher than the reference concentration R1. The hydrogen chemical concentrations V2 to V3 of the second to third hydrogen chemical concentration local minimum portions 225-2 to 225-3 may be higher than the reference concentrations R2 to R3 in the depth positions Z2 to Z3, respectively.

The hydrogen chemical concentration C1 of the first hydrogen chemical concentration peak 125-1 may be higher or lower than the oxygen chemical concentration $C_{OX1}$ in the depth position Z1. In the present example, the hydrogen chemical concentration C1 may be higher than the oxygen chemical concentration $C_{OX1}$.

The oxygen chemical concentration $C_{OX1}$ in the peak position of the first hydrogen chemical concentration peak 125-1 (that is, the depth position Z1) may be higher or lower than the shallowest reference concentration R1 in the depth position Z1. In the present example, the oxygen chemical concentration $C_{OX1}$ may be higher than the shallowest reference concentration R1.

In the present example, there is no chemical concentration peak of the n-type dopant other than hydrogen between the collector region 22 and the first hydrogen chemical concentration peak 125-1. That is, the doping concentration peaks 25 that exist in the buffer region 20 are all peaks of hydrogen donors. In another example, there may be a chemical concentration peak of the n-type dopant other than hydrogen such as phosphorous between the collector region 22 and the first hydrogen chemical concentration peak 125-1. In this case, the shallowest doping concentration peak is a concentration peak of the n-type dopant such as phosphorous.

Figure 6A:
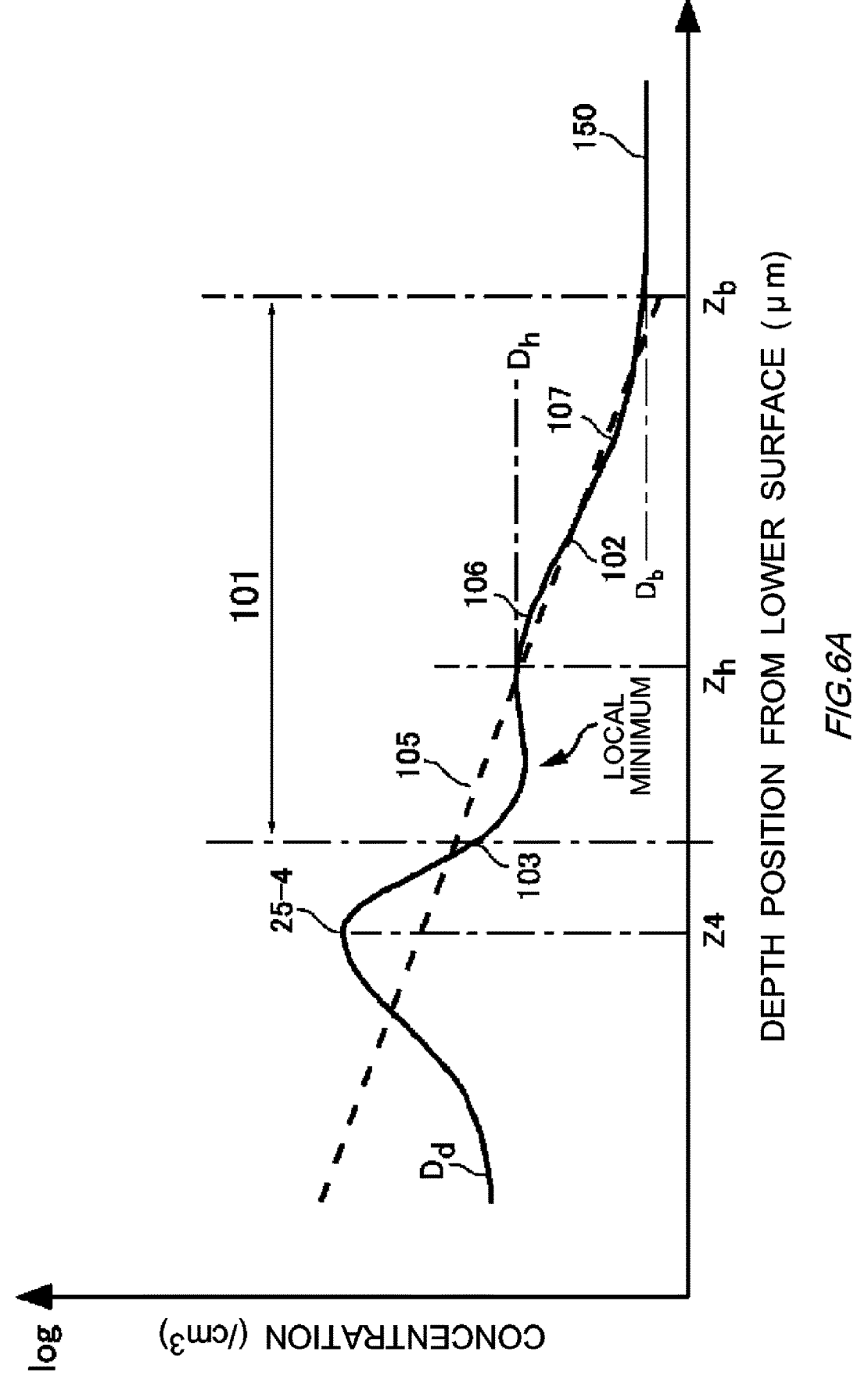
FIG. 6A illustrates an enlarged view of the vicinity of a slope 102 in FIG. 5.

FIG. 6A is an enlarged view of the vicinity of the slope 102 in FIG. 5. The distribution of the doping concentration $D_d$ in buffer region 20 may have an inflection point 103 on the upper surface 21 side above the fourth doping concentration peak 25-4. The inflection point 103 is a point where the symbol of the differential value obtained by second-level differentiating the doping concentration distribution with the depth position firstly changes In the direction from the depth position Z4 toward the upper surface 21 side.

The high concentration region 101 may be a region from the inflection point 103 to the boundary position $Z_b$ of the high concentration region 101 and drift region 18. The slope 102 is arranged on the upper surface 21 side above the inflection point 103. The slope 102 is a region where the doping concentration $D_d$ increases continuously from the boundary position $Z_b$ toward the lower surface 23 side. In the slope 102 in the present example, the doping concentration $D_d$ decreases from $D_h$ to $D_b$ continuously from the depth position $Z_h$ to the boundary position $Z_b$. The depth position $Z_h$ may be a position where the doping concentration distribution of the high concentration region becomes local maximum.

The slope 102 includes a convex region 106 on top. Since in the slope 102, the hydrogen implanted into the depth position Z4 diffuses and is formed, a convex region 106 is included on top. The region 106 may be a region in contact with the depth position $Z_h$. The slope 102 may include a convex region 107 on bottom, or may not. The region 107 may be arranged between the region 106 and the depth position $Z_b$.

The approximate concentration line 105 is a straight line that approximates the entire slope 102 with the least squares method. That is, a straight line that approximates the distribution of the doping concentration $D_d$ from the depth position $Z_h$ to the boundary position $Z_b$. In another example, the approximate concentration line 105 may also be a straight line coupling two points of the doping concentration $D_h$ in the depth position $Z_h$ and the doping concentration $D_b$ in the boundary position $Z_b$. The distribution of the doping concentration $D_d$ may have a local minimum value between the depth position $Z_h$ and the inflection point 103 as shown in FIG. 6A.

Figure 6B:
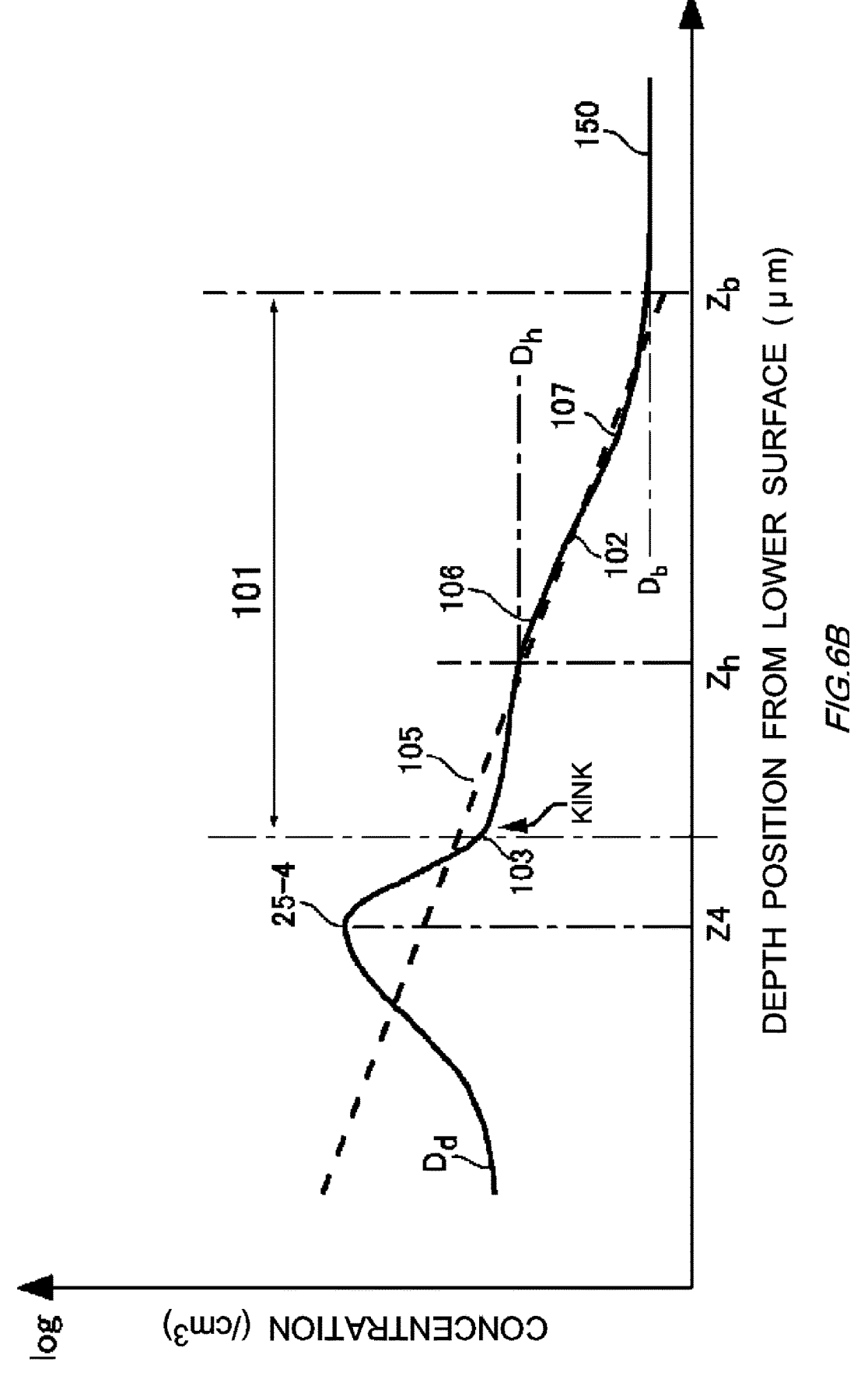
FIG. 6B illustrates another example of a doping concentration distribution in a high concentration region 101.

FIG. 6B illustrates another example of the doping concentration distribution of the high concentration region 101. It is different from the example in FIG. 6A in that the doping concentration distribution is in a kinked shape with no local minimum value. The distribution of the doping concentration $D_d$ in the present example has a portion in the kinked shape at the inflection point 103. Also, the doping concentration $D_d$ may monotonically decrease from the depth position Z4 to $Z_b$. Also, the depth position $Z_h$ in the present example may be the position where the differential value of the secondary differentiation of the doping concentration $D_d$ at depth position Z becomes its local maximum.

Figure 6C:
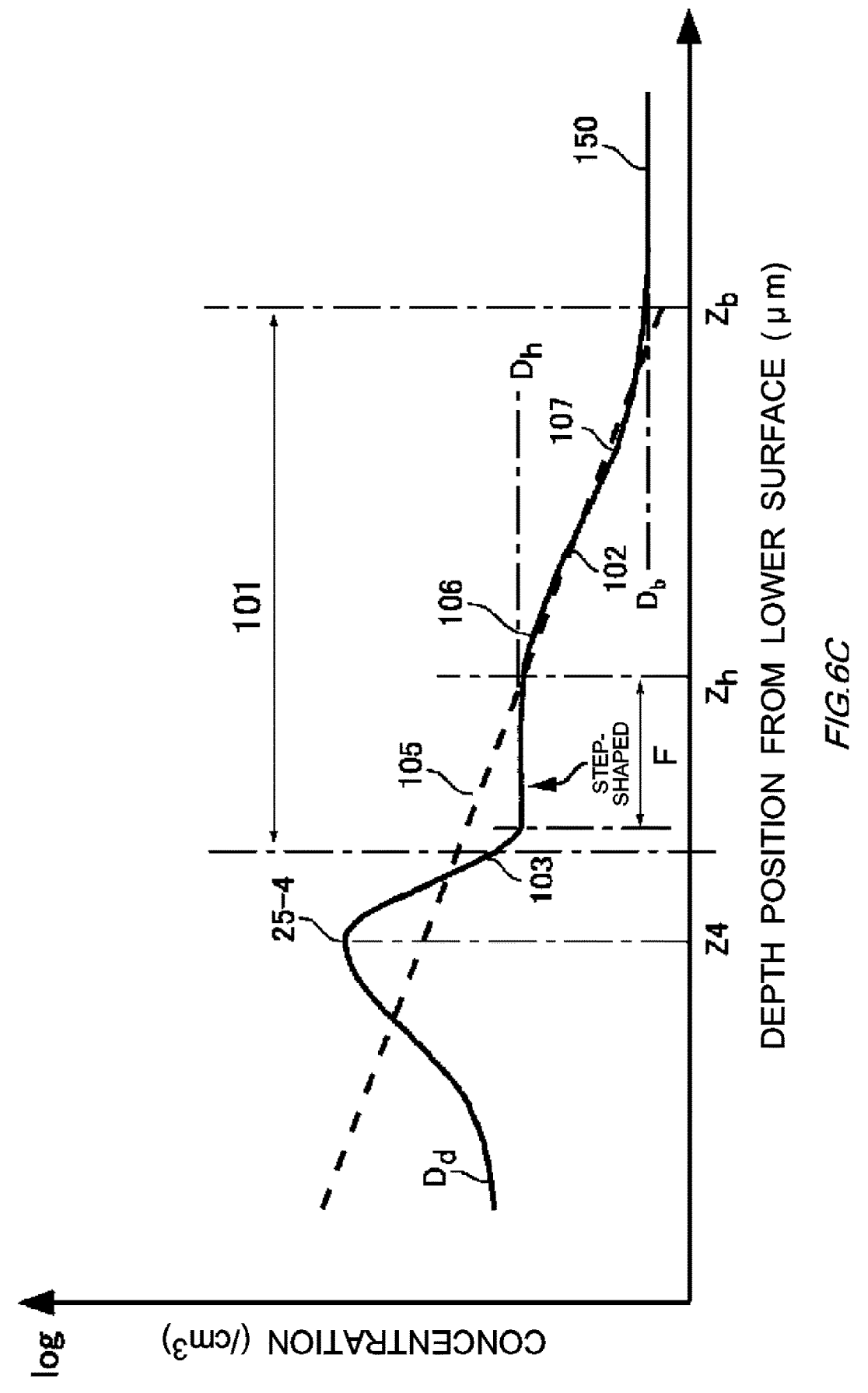
FIG. 6C illustrates another example of the doping concentration distribution in the high concentration region 101.

FIG. 6C illustrates another example of the doping concentration distribution of the high concentration region 101. It is different from the example in FIG. 6A in that the distribution of the doping concentration $D_d$ has a step-shaped portion F. The step-shaped portion F is a portion where the doping concentration $D_d$ is uniform (or flat) in the depth direction. The distribution of the doping concentration $D_d$ may further have a local minimum value as shown in FIG. 6A, or may not. The doping concentration $D_d$ in the present example monotonically decreases from the depth position Z4 to the portion F, and becomes a uniform concentration in the portion F, and monotonically decreases from the portion F to the depth position $Z_b$. The depth position $Z_h$ in the present example may be the position where the differential value of the secondary differentiation becomes its local maximum. In particular, the depth position $Z_h$ may be the position on the of the topmost upper surface 21 side of the flat region F.

Figure 7:
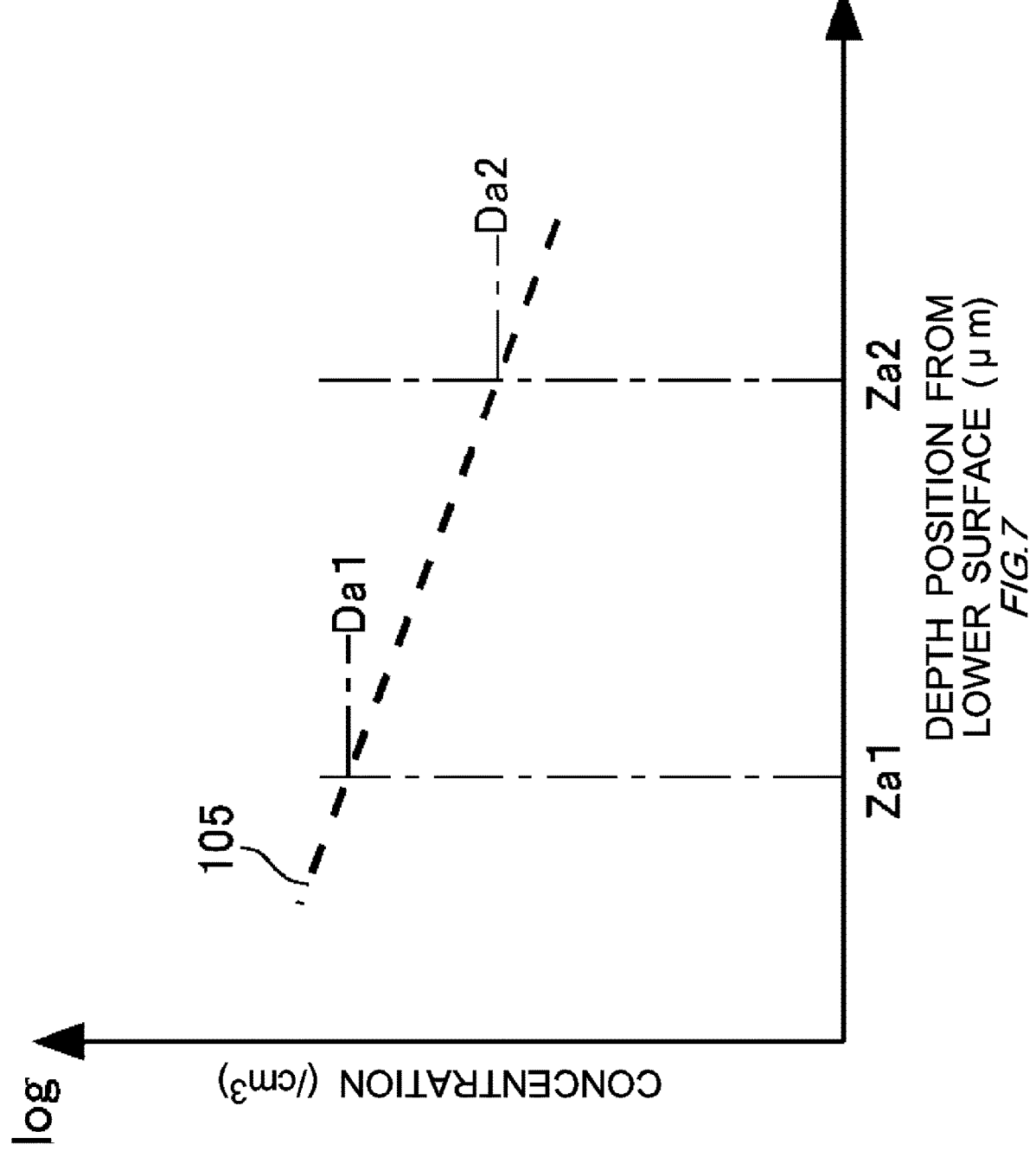
FIG. 7 illustrates a logarithmic gradient a of an approximate concentration line 105.

FIG. 7 illustrates a logarithmic gradient a of the approximate concentration line 105. The gradient a of the straight line passing through two points of (depth position, doping concentration)=(Za1, Da1), (Za2, Da2) is applied by the expression below.

$$\alpha = |\log_{10}(Da2) - \log_{10}(Da1)| / |Za2 - Za1|$$

The logarithmic gradient a of the approximate concentration line 105 can be calculated from the above expression using the values of any two points. The logarithm may be an ordinary logarithm or a natural logarithm. In the present example, the logarithm is an ordinary logarithm. The logarithmic gradient a of the approximate concentration line 105 may be from 1000 (/cm) to 2000 (/cm). In this way, the space charge region in case of short circuit can be brought even closer to the collector region, increasing the short circuit withstand capability, especially when the short circuit current is high. High short circuit current means a state where the gate voltage at the time of short circuit occurrence may be 10V or more, 15V or more, or may be 20V or more higher than the gate threshold voltage.

Figure 8:
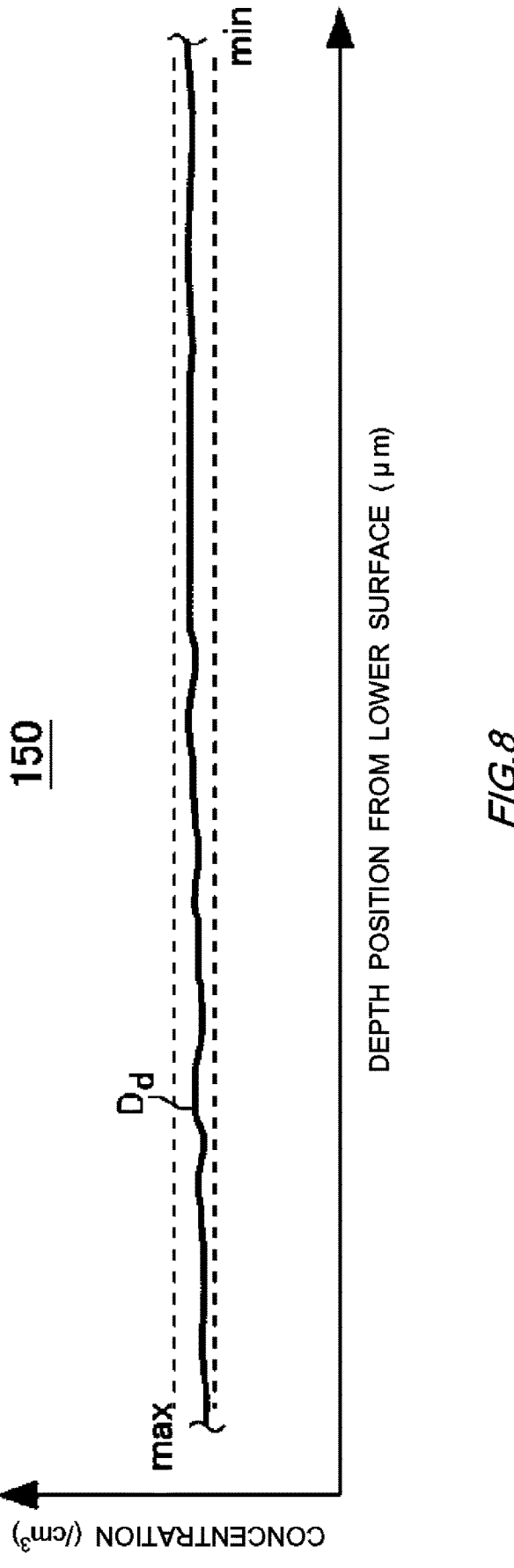
FIG. 8 illustrates a flat portion 150.

FIG. 8 illustrates the flat portion 150. The flat portion 150 is a portion where the region, in which the doping concentration $D_d$ is between the predetermined maximum value max and the predetermined minimum value min, is continuous in the depth direction. The maximum value max may use the maximum value of the doping concentration $D_d$ in the region. The minimum value min may be a value 50%, may be a value 70%, and may be a value 90% of the maximum value max.

Alternatively, with respect to the average concentration of the doping concentration distribution in a predetermined range in the depth direction, the region, in which the value of the doping concentration $D_d$ is within ±50%, or within ±30%, or within ±10% of the average concentration of the doping concentration distribution, may be regarded as the flat portion 150. The boundary position $Z_b$ described in FIG. 6A to 6C or the like may be the position where the doping concentration $D_b$ deviates from the range of the doping concentration $D_b$ of the flat portion 150 described in FIG. 8.

Figure 9:
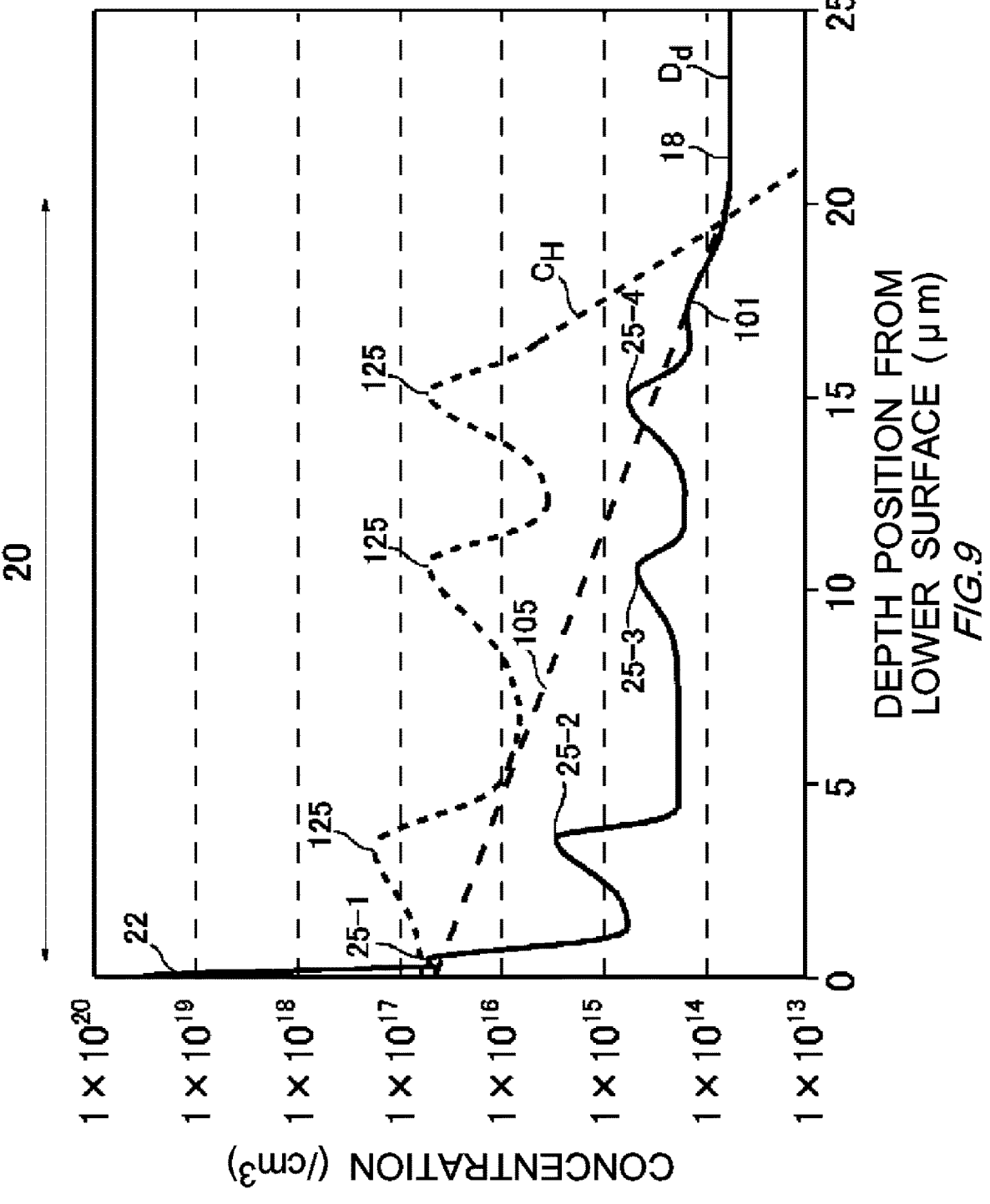
FIG. 9 illustrates an example of a distribution of a doping concentration Dd and a hydrogen chemical concentration CH in a comparative example.

FIG. 9 illustrates an example of a distribution of the doping concentration $D_d$ and the hydrogen chemical concentration $C_H$ in the comparative example. In the present example, the first doping concentration peak 25-1 is the concentration peak of phosphorous. In the present example, the first doping concentration peak 25-1 is arranged near the lower surface 23. Therefore, the distance between the high concentration region 101 and the first doping concentration peak 25-1 increases, and the first doping concentration peak 25-1 is greater than the approximate concentration line 105.

In such as case, for example, when a scratch is generated on the lower surface 23, the breakdown voltage degradation is likely to occur. Also, since the buffer region 20 becomes longer, the short circuit withstand capability may be lowered. According to the examples shown in FIG. 1 to FIG. 8, the short circuit withstand capability can be secured while suppressing the breakdown voltage degradation.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 11: well region; 12: emitter region; 14: base region; 15: contact region; 16: accumulation region; 18: drift region; 20: buffer region; 21: upper surface; 22: collector region; 23: lower surface; 24: collector electrode; 25: doping concentration peak; 29: linear portion; 30: dummy trench portion; 31: edge portion; 32: dummy dielectric film; 34: dummy conductive portion; 38: interlayer dielectric film; 39: linear portion; 40: gate trench portion; 41: edge portion; 42: gate dielectric film; 44: gate conductive portion; 52: emitter electrode; 54: contact holes; 60, 61: mesa portion; 70: transistor portion; 80: diode portion; 81: extension region; 82: cathode region; 90: edge termination structure portion; 92: guard ring; 100: semiconductor device; 101: high concentration region; 102: slope; 103: inflection point; 105: approximate concentration line; 106: region; 107: region; 112: gate pad; 125: hydrogen chemical concentration peak; 130: outer circumferential gate runner; 131: active-side gate runner; 150: flat portion; 160: active portion; 202: end side; 225: hydrogen chemical concentration local minimum portion

What is claimed is:

1. A semiconductor device, comprising:

a semiconductor substrate including an upper surface and a lower surface;

a drift region of a first conductivity type, provided in the semiconductor substrate; and a buffer region of the first conductivity type with a doping concentration higher than the drift region, provided between the drift region and the lower surface of the semiconductor substrate, wherein the buffer region has a plurality of hydrogen chemical concentration peaks including a deepest hydrogen chemical concentration peak furthest from the lower surface, arranged in different positions in a depth direction of the semiconductor substrate;

a plurality of doping concentration peaks including a shallowest doping concentration peak closest to the lower surface, arranged in different positions in the depth direction of the semiconductor substrate;

a high concentration region provided between the deepest hydrogen chemical concentration peak and the drift region; and an oxygen chemical concentration having a non-zero slope, wherein a doping concentration distribution in the depth direction of the high concentration region has a slope in contact with the drift region and has a doping concentration gradually decreasing toward the drift region, wherein the slope includes a convex portion on top, wherein an approximate concentration line that approximates a gradient of the slope with a straight line has a shallowest reference concentration at a depth position of the shallowest doping concentration peak, and wherein a doping concentration of the shallowest doping concentration peak is from 5% to 50% of the shallowest reference concentration.

2. The semiconductor device according to claim 1, wherein the doping concentration of the shallowest doping concentration peak is 10% of the shallowest reference concentration or more.

3. The semiconductor device according to claim 1, wherein the approximate concentration line is a straight line that approximates, with a least squares method, a doping concentration distribution from a position closest to the drift region to a boundary position of the high concentration region and the drift region among positions where the doping concentration distribution of the high concentration region becomes its local maximum.

4. The semiconductor device according to claim 1, wherein the approximate concentration line is a straight line coupling two points of the doping concentration in a position closest to the drift region and the doping concentration in a boundary position of the high concentration region and the drift region among positions where the doping concentration distribution of the high concentration region becomes its local maximum.

5. The semiconductor device according to claim 1, wherein a logarithmic slope of the approximate concentration line is from 100 (/cm) to 2000 (/cm).

6. The semiconductor device according to claim 1, wherein a distance between the shallowest doping concentration peak and the lower surface of the semiconductor substrate is 1 µm or more.

7. The semiconductor device according to claim 6, wherein the distance between the shallowest doping concentration peak and the lower surface of the semiconductor substrate is less than 3 µm.

8. The semiconductor device according to claim 1, wherein a distance between the deepest hydrogen chemical concentration peak and the lower surface of the semiconductor substrate is 20 µm or less.

9. The semiconductor device according to claim 8, wherein:

the plurality of hydrogen chemical concentration peaks includes a shallowest hydrogen chemical concentration peak closest to the lower surface; and a distance between the shallowest hydrogen chemical concentration peak and the deepest hydrogen chemical concentration peak is 15 µm or less.

10. The semiconductor device according to claim 1, wherein a distance between a boundary position of the high concentration region and the drift region and the lower surface of the semiconductor substrate is 25 µm or less.

11. The semiconductor device according to claim 1, wherein:

the plurality of doping concentration peaks includes a deepest doping concentration peak furthest from the lower surface; and in the approximate concentration line, when a concentration in a depth position of the deepest doping concentration peak is referred to as a deepest reference concentration, a doping concentration of the deepest doping concentration peak is higher than the deepest reference concentration.

12. The semiconductor device according to claim 1, wherein:

the plurality of doping concentration peaks includes a second doping concentration peak that is second closest to the lower surface; and in the approximate concentration line, when a concentration in a depth position of the second doping concentration peak is referred to as a second reference concentration, a doping concentration of the second doping concentration peak is lower than the second reference concentration.

13. The semiconductor device according to claim 12, wherein the doping concentration of the second doping concentration peak is from 10% to 50% of the second reference concentration.

14. The semiconductor device according to claim 12, wherein the doping concentration of the shallowest doping concentration peak is 10 times of the doping concentration of the second doping concentration or less.

15. The semiconductor device according to claim 12, wherein a ratio of the doping concentration of the shallowest doping concentration peak to the shallowest reference concentration is greater than a ratio of the doping concentration of the second doping concentration to the second reference concentration.

16. The semiconductor device according to claim 12, wherein:

the plurality of hydrogen chemical concentration peaks includes a second hydrogen chemical concentration peak that is second closest to the lower surface; and a hydrogen chemical concentration of the second hydrogen chemical concentration peak is lower than the second reference concentration.

17. The semiconductor device according to claim 1, further comprising a collector region of a second conductivity type provided between the buffer region and a lower surface of the semiconductor substrate, wherein the plurality of hydrogen chemical concentration peaks includes a shallowest hydrogen chemical concentration peak closest to the lower surface; and wherein no chemical concentration peak of an n-type dopant other than hydrogen exists between the collector region and the shallowest hydrogen chemical concentration peak.

18. The semiconductor device according to claim 1, wherein:

the plurality of hydrogen chemical concentration peaks includes a shallowest hydrogen chemical concentration peak closest to the lower surface; and a hydrogen chemical concentration of the shallowest hydrogen chemical concentration peak is higher than the shallowest reference concentration.

19. The semiconductor device according to claim 1, wherein:

the plurality of hydrogen chemical concentration peaks includes a shallowest hydrogen chemical concentration peak closest to the lower surface; and a hydrogen chemical concentration of the shallowest hydrogen chemical concentration peak is lower than the shallowest reference concentration.

20. The semiconductor device according to claim 1, wherein:

the plurality of hydrogen chemical concentration peaks includes a shallowest hydrogen chemical concentration peak closest to the lower surface; and the oxygen chemical concentration in a peak position of the shallowest hydrogen chemical concentration peak is higher than the shallowest reference concentration.

21. The semiconductor device according to claim 1, wherein:

the plurality of hydrogen chemical concentration peaks includes a shallowest hydrogen chemical concentration peak closest to the lower surface; and the oxygen chemical concentration in a peak position of the shallowest hydrogen chemical concentration peak is lower than the shallowest reference concentration.

22. A semiconductor device, comprising:

a semiconductor substrate including an upper surface and a lower surface;

a drift region of a first conductivity type, provided in the semiconductor substrate; and a buffer region of the first conductivity type with a doping concentration higher than the drift region, provided between the drift region and the lower surface of the semiconductor substrate, wherein the buffer region has a plurality of hydrogen chemical concentration peaks including a deepest hydrogen chemical concentration peak furthest from the lower surface, arranged in different positions in a depth direction of the semiconductor substrate;

a plurality of doping concentration peaks including a shallowest doping concentration peak closest to the lower surface, arranged in different positions in the depth direction of the semiconductor substrate;

a high concentration region provided between the deepest hydrogen chemical concentration peak and the drift region; and an oxygen chemical concentration in a peak position of a shallowest hydrogen chemical concentration peak is not equal to the shallowest reference concentration, wherein a doping concentration distribution in the depth direction of the high concentration region has a slope in contact with the drift region and has a doping concentration gradually decreasing toward the drift region, wherein the slope includes a convex portion on top, wherein an approximate concentration line that approximates a gradient of the slope with a straight line has a shallowest reference concentration at a depth position of the shallowest doping concentration peak, and wherein a doping concentration of the shallowest doping concentration peak is from 5% to 50% of the shallowest reference concentration.

23. A semiconductor device, comprising:

a semiconductor substrate including an upper surface and a lower surface;

a drift region of a first conductivity type, provided in the semiconductor substrate; and a buffer region of the first conductivity type with a doping concentration higher than the drift region, provided between the drift region and the lower surface of the semiconductor substrate, wherein the buffer region has a plurality of hydrogen chemical concentration peaks including a deepest hydrogen chemical concentration peak furthest from the lower surface, arranged in different positions in a depth direction of the semiconductor substrate, wherein the deepest hydrogen chemical concentration peak is located at a first depth position;

a plurality of doping concentration peaks including a shallowest doping concentration peak closest to the lower surface, arranged in different positions in the depth direction of the semiconductor substrate, wherein the shallowest doping concentration peak is located at a second depth position; and a high doping concentration region provided between the deepest hydrogen chemical concentration peak and the drift region, wherein a doping concentration distribution in the depth direction of the high concentration region has a slope in contact with the drift region and has a doping concentration gradually decreasing toward the drift region, wherein the slope includes a convex portion on top in which no hydrogen chemical concentration peak is provided, wherein an approximate concentration line that approximates the entire slope with a least squares method of the slope with a straight line and extrapolated at least to a shallowest peak position of the doping concentration peak and has a shallowest reference concentration at the depth position of the shallowest doping concentration peak, wherein a doping concentration of the shallowest doping concentration peak is from 5% to 50% of the shallowest reference concentration, and wherein on a side of the upper surface than the first depth position, the doping concentration distribution with the convex portion on top includes:

a third depth position at which a secondary differentiation of the doping concentration distribution is zero;

a first region from the third depth position to a fourth depth position having a positive value of the secondary differentiation of the doping concentration distribution, the first region being provided on a side of the lower surface than the third depth position; and a second region from the fourth depth position to a fifth depth position having a negative value of the secondary differentiation of the doping concentration distribution, the second region being provided on the side of the upper surface than the third depth position.

\* \* \* \* \*